(12) United States Patent
Carpenter et al.

(10) Patent No.: US 7,409,305 B1
(45) Date of Patent: Aug. 5, 2008

(54) PULSED RING OSCILLATOR CIRCUIT FOR STORAGE CELL READ TIMING EVALUATION

(75) Inventors: Gary D. Carpenter, Austin, TX (US); Jente B Kuang, Austin, TX (US); Kevin J. Nowka, Georgetown, TX (US); Liang-Teck Pang, Albany, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/682,542

(22) Filed: Mar. 6, 2007

(51) Int. Cl.
*G06F 3/01* (2006.01)

(52) U.S. Cl. .......................... 702/75; 702/74; 702/183; 702/188

(58) Field of Classification Search .................. 702/75, 702/79, 106, 117, 118, 182, 183, 188; 365/154, 365/189; 331/1; 438/200
See application file for complete search history.

(56) References Cited

U.S. PATENT DOCUMENTS

| | | | |
|---|---|---|---|
| 5,781,469 | A | 7/1998 | Pathak et al. |
| 5,870,404 | A | 2/1999 | Ferraiolo et al. |
| 6,452,459 | B1 | 9/2002 | Chan et al. |
| 6,538,522 | B1 | 3/2003 | Aipperspach et al. |
| 6,909,301 | B2 | 6/2005 | Korson et al. |
| 7,046,094 | B2 | 5/2006 | Belluomini et al. |
| 7,173,875 | B2* | 2/2007 | Chan et al. ............ 365/230.06 |
| 7,250,821 | B2* | 7/2007 | Momii et al. ............... 331/1 A |
| 2002/0135343 | A1 | 9/2002 | Underbrink et al. |
| 2004/0061561 | A1 | 4/2004 | Monzel et al. |
| 2005/0063232 | A1 | 3/2005 | Chan et al. |
| 2005/0078508 | A1 | 4/2005 | Chan et al. |
| 2005/0204211 | A1 | 9/2005 | Gouin et al. |
| 2006/0050600 | A1 | 3/2006 | Venkatraman et al. |

(Continued)

FOREIGN PATENT DOCUMENTS

JP          09294055 A       11/1997

OTHER PUBLICATIONS

U.S. Appl. No. 11/250,061, filed Oct. 13, 2005, Kuang et al.

(Continued)

*Primary Examiner*—Eliseo Ramos-Feliciano
*Assistant Examiner*—Felix Suarez
(74) *Attorney, Agent, or Firm*—Mitch Harris, Atty at Law, LLC; Andrew M. Harris; Casimer K. Salys

(57) ABSTRACT

A methor for storage cell read timing evaluation provides read strength information by using a pulsed ring oscillator. A pulse generator is coupled to a bitline to which the storage cell to be measured is connected. The storage cell thereby forms part of the ring oscillator and the read strength of the storage cell is reflected in the frequency of oscillation. A pulse regeneration circuit is included in the ring so that the storage cell read loading does not cause the oscillation to decay. Alternatively, a counter may be used to count the number of oscillations until the oscillations decay, which also yields a measure of the read strength of the storage cell. The pulse generator may have variable output current, and the current varied to determine a change in current with the storage cell enabled and disabled that produces the same oscillation frequency. The read current is the difference between currents.

17 Claims, 5 Drawing Sheets

U.S. PATENT DOCUMENTS

2006/0097802 A1 5/2006 Chan et al.
2007/0058448 A1* 3/2007 Joshi et al. ............. 365/189.01
2007/0086232 A1* 4/2007 Joshi et al. ................... 365/154

OTHER PUBLICATIONS

U.S. Appl. No. 11/609,598, filed Dec. 12, 2006, Ehrenreich et al.
U.S. Appl. No. 11/781,994, filed Jul. 24, 2007, Kuang et al.
U.S. Appl. No. 11/260,571, filed Oct. 27, 2005, Chuang et al.
U.S. Appl. No. 11/559,436, filed Nov. 14, 2006, Carpenter et al.
U.S. Appl. No. 11/225,652, filed Sep. 13, 2005, Joshi et al.
U.S. Appl. No. 11/250,019, filed Oct. 13, 2005, Joshi et al.

* cited by examiner

PULSED RING OSCILLATOR CIRCUIT FOR STORAGE CELL READ TIMING EVALUATION

BACKGROUND OF THE INVENTION

1. Technical Field

The present invention relates generally to memory design evaluation circuits, and more particularly to a memory circuit having an oscillator circuit that has a frequency that accurately reflects internal read timing of a memory cell.

2. Description of the Related Art

Storage cell speed, circuit area and environmental operating ranges, e.g., supply voltage and temperature range, are critical limitations in today's processing systems and are predicted to become even more of a critical limitation as technologies move forward. In particular, static random access memory (SRAM) cells are used in processor caches and external storage to provide fast access to data and program instructions. Static storage cells are also used within processors and other digital circuits for storing values internally, for example, in processor registers.

With processor cycle frequencies reaching well above 4 Ghz, development of SRAM cells that can store and provide access to stored values within that period has become necessary. However, actually measuring the internal read timing of memory cells presents a challenge. In a typical storage cell, there is no mechanism for determining read timing of the cell itself, only the total delay including the wordline access and bitline read circuits. Probing the storage cell affects the operation of the storage circuit and therefore the results of any evaluation based on probing the cell. Test circuits can be built that simulate the operation of a storage cell for the purposes of cell read timing measurement, but are typically not integrated within the actual environment of a cell in a storage array, including bitline and wordline loading effects.

Memory cell timing for a combination of read and write delays has been evaluated using ring oscillator circuits or cascaded cell delay circuits wherein a large number of cells are cascaded. A ring oscillator may be formed with feedback of an output of the last cell to an input of the first cell, or a one-shot delay may be measured through the cascade of cells. The frequency at which the ring oscillator operates or the one-shot delay indicates the read/write cycle timing, which provides some measure of ultimate operating frequency and access times of the storage array. Typically, the cell design is then changed in subsequent design iterations having parameters adjusted in response to the results of the ring oscillator test.

However, the above-mentioned ring oscillator circuits and other delay-oriented circuits for performing delay tests do not provide an independent measure of read timing, since the inclusion of a cell in the oscillator ring or delay line requires that the cell values will be written in some manner to change the value in the next cell as a transition of the oscillation is propagated around the ring. Further, such circuits do not provide for measuring read current or read strength independent of the speed of a write operation.

It is therefore desirable to provide a test circuit and method for accurately measuring cell read timing independent of write timing under the load conditions of actual array. It is further desirable to provide a circuit and method that can measure read strength/read current directly. It is further desirable to provide such a test circuit that can be integrated within a production storage device.

SUMMARY OF THE INVENTION

The objective of accurately determining storage cell read timing and read strength/read current is accomplished in a method and circuit. The circuit is a ring oscillator that includes one or more storage cells, which can be a storage cell in an array that is selected by enabling a wordline. Variation of read timing along the array can be measured by enabling each wordline in turn, and taking measurements. A bitline connected to the selected storage cell is stimulated by a pulse generating circuit and the pulse generating circuit also has an input coupled to the bitline, so that a ring oscillator is formed and the current drawn by the storage cell read alters the operation and thus the frequency of the ring oscillator. The loading of the storage cell corresponds to the critical read timing, which is the time required for the cell to pull the bitline down from a pre-charged condition. By measuring the ring oscillator frequency with the wordline disabled and then enabled, the difference in oscillator period can be computed and is equal to the delay contribution due to the storage cell.

The pulse generator is triggered by a signal returned from the bitline, which is stretched by a pulse regenerator, so that pulse width reduction caused by the storage cell loading is overcome and oscillation is continually sustained. Alternatively, the pulse regenerator may be omitted and the oscillation can be permitted to decay as the oscillation frequency increases due to progressive shortening of the pulse. A counter is then used to determine the number of periods of oscillation, which provides a measure of the storage cell strength.

The pulse generator may have a variable current output that is controlled by a control voltage. By measuring the current at which the frequency with all of the wordlines disabled is equal to the frequency with a wordline enabled at another predetermined current level, the read current strength of the storage cell can be determined as the difference in the currents. Multiple word lines can be enabled in the array to measure an average storage cell strength.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns a test circuit for evaluating read strength and read timing of static storage cells, e.g., registers or static memory cells, in order to facilitate design improvement and determination of read delay and read cycle timing margins. The read delay of a single storage cell is measured by generating a pulse on one of the bitlines connected to the storage cell, which is enabled by enabling the wordline of the row of the storage cell. The cell state is preset so that the bitline being pulsed is in a state opposite the bitline pre-charge state, and the other bitline may be strongly held in the pre-charged state, so that the storage cell does not change state. The difference between the ring oscillator frequency with the wordline enabled and the wordline disabled is substantially due to the additional storage cell read current, and therefore differences in frequency between storage cells under test provides a measure of read strength/read delay variation.

The pulse generator output may have a variable pull-down current provided to the bitline. The corresponding pull-up device serves as the precharge device. The frequency can be matched for the wordline-enabled versus wordline-disabled state by changing the current of the output driver. The change in current in the output driver provides a direct measure of the cell read current, which is also the measure of the read strength and determines the read strength. A current mirror may be used to provide for current measurement through a probe, so that the output driver current can be accurately measured. The output frequency of the ring oscillator increases when the wordline of the storage cell is enabled, since the fall time (pull-down) of the bitline is faster when the storage cell is enabled.

The circuit and methods described above provide an accurate measure of the read timing of the storage cells in an actual array implementation. Switches may be included to select the bitline under test and operated by a scan chain, so that each storage cell can be evaluated by a particular wordline/bitline combination. A production die may be implemented that includes the test circuit permanently wired-in-place and enabled in a test mode, or a sacrificial metal can be used to implement the circuit on a production wafer, which can then be modified into an operational circuit via a permanent metal layer that replaces the sacrificial layer.

Figure 1:
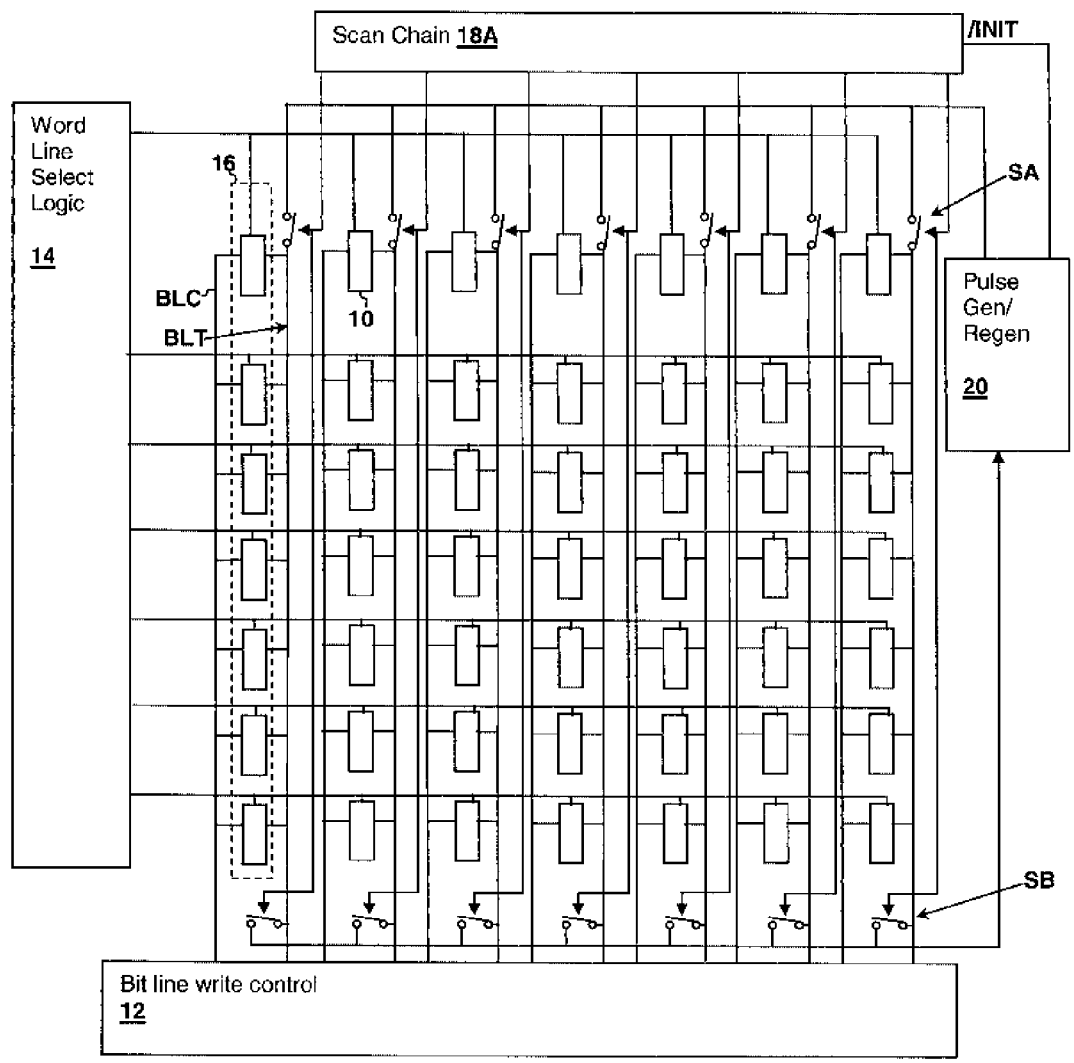
FIG. 1 is a schematic diagram of a test array in accordance with an embodiment of the invention.

With reference now to the figures, and in particular with reference to FIG. 1, a test storage array circuit in accordance with an embodiment of the invention is shown. An array of storage cells 10 comprising columns 16 is connected to a wordline select logic 14, which in normal operation generates wordline select signals, but under test scan chain control can be programmed to enable one or more wordlines to enable particular storage cells 10 on to bitlines BLT. A bitline write control circuit 12 provides the write input to the array under normal operating conditions, but in the test operation of the present invention is controlled by scanned-in values to hold bitlines BLC in the pre-charge condition, so that the values stored in storage cells 10 as reflected at bitlines BLT does not change during ring oscillator tests. Bitline write control circuit is disabled from bitlines BLT during ring oscillator operation. A set of switches SA selectively couple a bitline BLT to the output of a pulse generator/regeneration circuit 20 that forms a ring oscillator by receiving input from the same bitline selected by a set of switches SB, more than one bitline BLT can be optionally enabled, for averaging measurements as mentioned above for multiple wordline enabled tests. Switches SA and SB are controlled by another set of bits provided by a scan chain 18A. Scan chain 18A also provides an /INIT signal to pulse generator/regeneration circuit 20 to start the ring oscillator.

Figure 2:
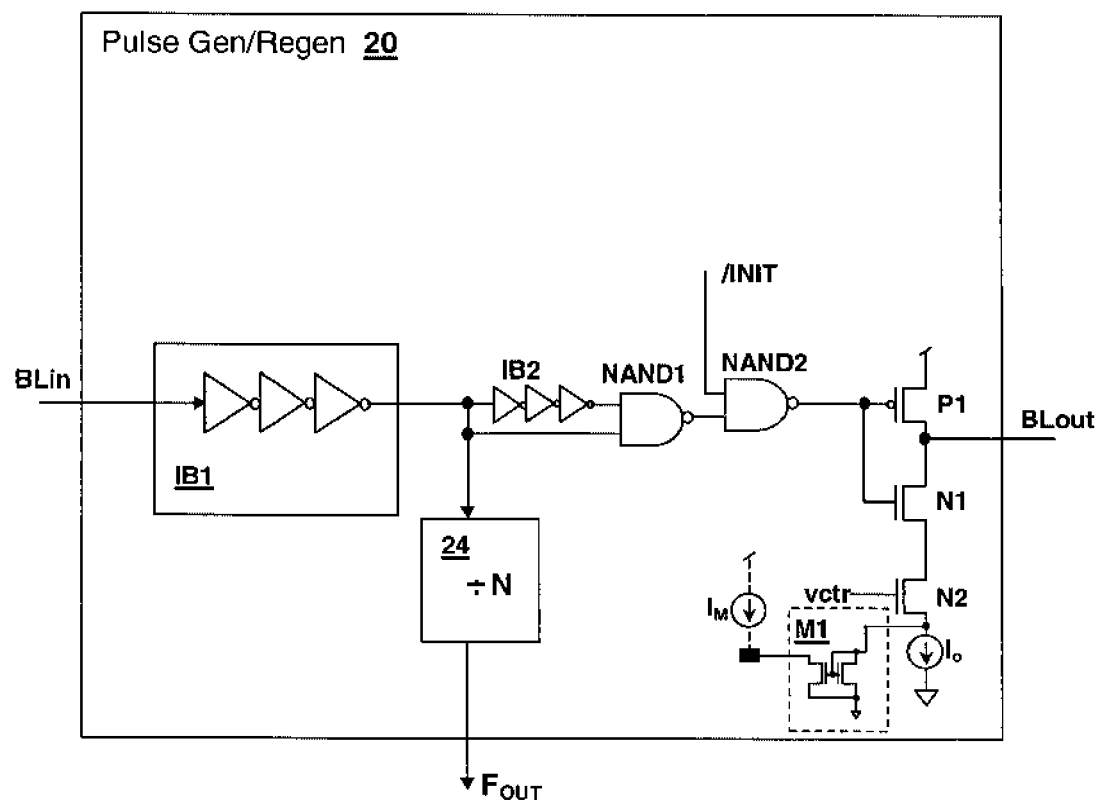
FIG. 2 is a schematic diagram depicting details of pulse generator/regenerator 20 of FIG. 1, in accordance with an embodiment of the invention.

Referring now to FIG. 2, details of pulse generator/regeneration circuit 20 of FIG. 1 is shown in accordance with an embodiment of the present invention. An input B1in receives a signal from a bitline BLT as selected by one of switches SB. An inverter bank IB1 of odd order both delays the signal and stretches the pulse to a width greater than the original pulse by virtue of special design techniques as will be described in further detail below. The output of inverter bank IB1 provides the input to a divider 24 that provides an output, generally via a probe pad, so that external frequency measurements can be performed by an external frequency counter. A second inverter bank IB2 of odd order and a logical-NAND gate NAND1 provide another circuit that restores the pulse to its original width, so that the ring oscillator frequency is constant and oscillation is sustained without decaying. If the pulse width is not restored, the shortening of pulse width due to the storage cell read loading will cause an increase in frequency until the oscillation stops by failing to trigger pulse generator 20.

A second logical-NAND gate controls the ring oscillator via the /INIT signal provided by scan chain 18. The pulse is applied to bitline BLT through one of switches SA by a transistor circuit that includes transistors P1, N1 and N2. Transistor P1 serves as the pre-charge circuit for bitline BLT and is sized appropriately. Transistors N1 and N2 divert the precharge current from storage cell 10 under test, but may be disabled, depending on the value of voltage vctr. As mentioned above, the value of voltage vctr may be adjusted to control the current of the output of pulse generator 20 when all of the wordlines are disabled. First, a frequency measurement is taken with the wordline of a selected storage cell 10 enabled to obtain a first frequency $F_o$. The current through transistors N1 and N2 can be set to zero for the bitline pull-down state by setting vctr=<0, alternatively the current through transistors N1 and N2 can be measured and subsequently taken into account. Then, the wordline is disabled and the current through transistors N1 and N2 is adjusted to obtain a ring oscillator frequency equal to $F_o$. The current through transistors N1 and K2 obtained above is the read current of the particular storage cell 10 enabled in the first frequency measurement, after subtracting any current through transistors N1 and N2 that was present during the initial measurement of frequency $F_o$ with the wordline enabled. Current $I_o$ may be computed from the characteristics of transistor N2 and voltage vctr, may be measured directly by providing $I_o$ from a test pad, or optionally determined from current $I_M$ of a current mirror M1, which is provided through a test pad. Alternatively, or in combination with the above measurement, frequency measurements can be made without changing the current through transistors N1 and N2. A first frequency $F_1$ is obtained with the wordline enabled and a second frequency $F_2$ is obtained with the wordline disabled. The difference between the periods $1/F_1 - 1/F_2$ provides a measure of the read delay and read strength.

Figure 3A:
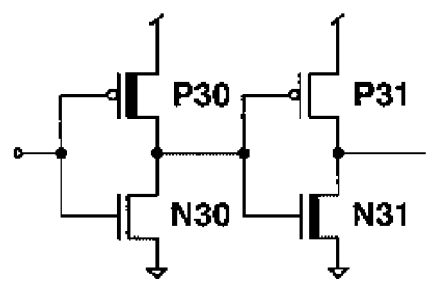
FIGS. 3A-3C are schematic diagrams depicting circuits for performing pulse stretching in pulse generator/regenerator 20 of FIG. 2.
Figure 3B:
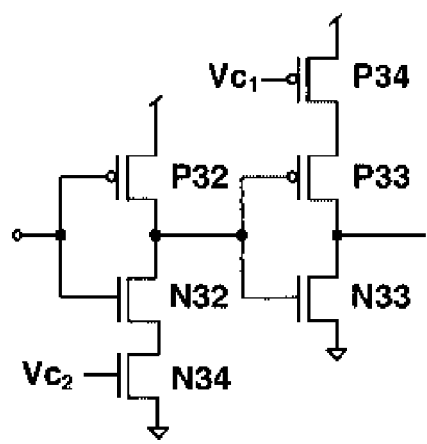
Figure 3C:
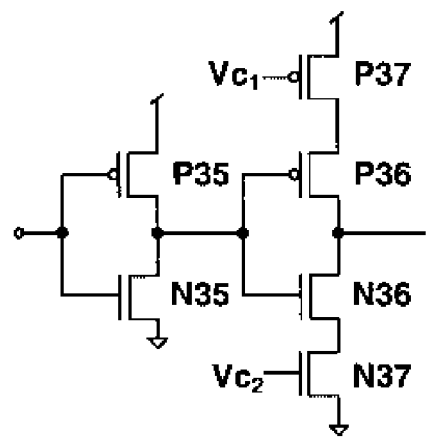

Referring now to FIGS. 3A-3C various pulse stretching inverter circuit embodiments are shown, as may be used in inverter banks IB1 and IB2 of FIG. 2. FIG. 3A shows two cascaded inverters formed by transistors P30,N30 and P31, N31, respectively. Transistor P30 is sized larger than transistor N30, which causes the fall time of the first inverter to be slower than the rise time, stretching the positive portion of an input pulse. Similarly Transistor N31 is sized larger than transistor P31, which causes the rise time of the second inverter to be slower than the fall time time, stretching the negative portion of the output of the first inverter. The net result is a stretching of the positive portion of the input pulse. The depicted inverter is inserted in inverter bank IB1 after a first inverter of either normal design or strong-N design similar to the inverter formed by transistors P31 and N31, so that the signal provided at the gates of transistors P30 and N30 is the invert of the bitline BLT signal and therefore stretches the portion of the pulse corresponding to the non-precharge state in which storage cell 10 is pulling down bitline BLT.

FIG. 3B shows another inverter design having an asymmetric response that may be alternatively used in place of the circuit of FIG. 3A in inverter banks IB1 and IB2. Transistors N32,P32 and N33,P33 form two cascaded inverters as in FIG. 3A, but are similarly sized. Foot transistor N34 and header transistor P34 are biased by voltages $Vc_1$ and $Vc_2$ so that the fall time of the first inverter and the rise time of the second inverter are slowed as in the circuit of FIG. 3A, again causing stretching of the positive portion of a pulse provided to the gates of transistors N32 and P32. FIG. 3C shows another alternative pulse-stretching circuit that includes a standard inverter formed by transistors N35 and P35, followed by another inverter formed by transistors N36 and P36. Foot transistor N37 and header transistor P37 are biased by voltages $Vc_1$ and $Vc_2$ so that the fall time and rise time of the second inverter are both slowed as in the circuit of FIG. 3B, but in the circuit of FIG. 3C, causes stretching of both the positive and negative portion of a pulse provided to the gates of transistors N35 and P35. Asymmetrical stretching can then be controlled by adjusting voltages $Vc_1$ and $Vc_2$.

Figure 4:
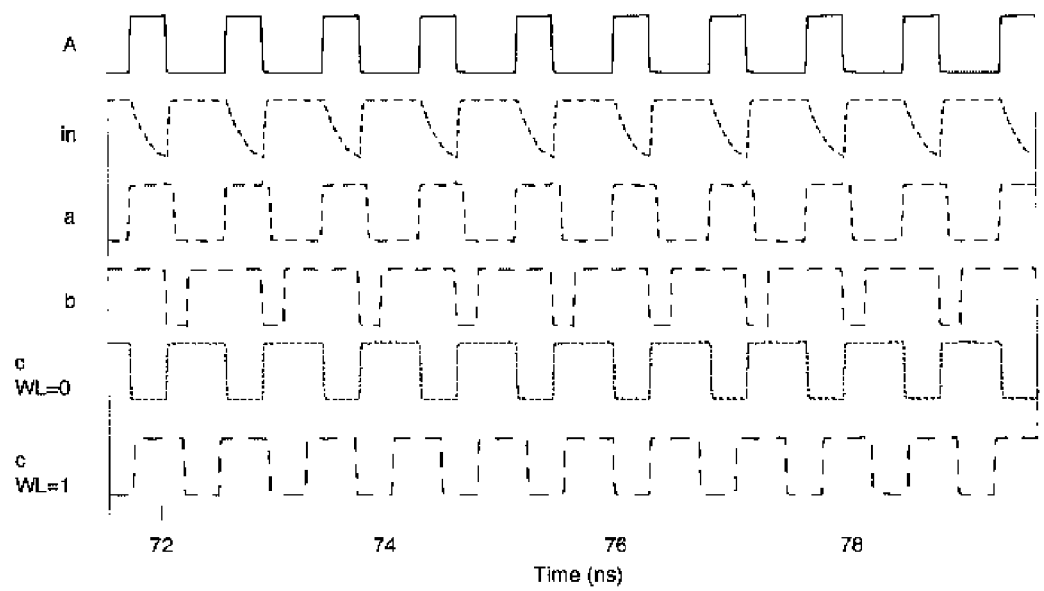
FIG. 4 is a signal diagram depicting signals in the test array of FIG. 1.

Referring now to FIG. 4, signals within the test array of FIG. 1 are depicted in a time-voltage diagram. Trace A corresponds to the output of logical NAND-gate NAND2 of pulse generator/regeneration circuit 20. Trace in shows the signal from bitline BLT at the input to pulse generator/regeneration circuit 20. Trace a shows the output of inverter bank IB1, which has stretched the positive portion of the signal at the input of pulse generator/regeneration circuit 20 until the width of the positive portion is greater than the original pulse from the output of logical NAND-gate NAND2 shown in trace A. Trace b shows the output of inverter bank IB2, which has stretched the negative portion of the negative portion and delayed the signal so that logical-NAND gate NAND1 generates the signal shown in trace c. Trace c is shown for the wordline enabled WL=1 condition (as shown in the other traces), as well as the WL=0 condition (not shown in the other traces). The frequency increase due to the additional read current when WL=1 can be seen from the waveforms.

Figure 5:
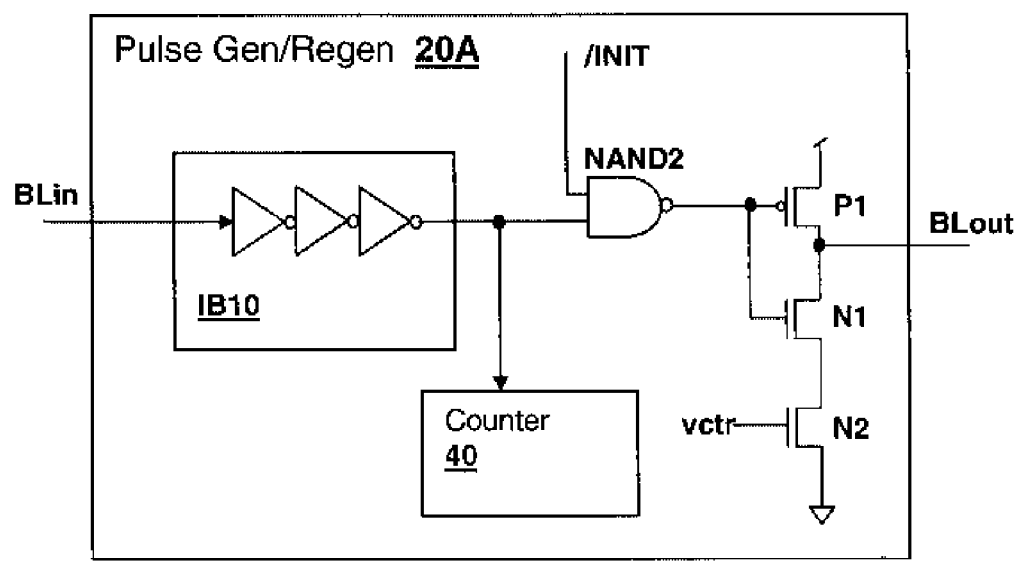
FIG. 5 is a schematic diagram depicting details of a pulse generator/regenerator 20A that may be used in the array FIG. 1, in accordance with another embodiment of the invention.

Referring now to FIG. 5, a pulse generator/regeneration circuit 20A is shown in accordance with an alternative embodiment of the present invention as may be used in the test array circuit of FIG. 1. In the depicted embodiment, asymmetric pulse stretching is not employed in inverter bank IB1 and the ring oscillator frequency is allowed to increase to the point where a counter 40 is no longer triggered, and oscillation will either cease or possibly continue at a very high frequency. The output count of counter 40 is proportional to the storage cell 10 read current and a wide /INIT pulse is desirable to maximize the resolution of the measurement. The balance of the circuit including logical-NAND gate NAND1 and transistors P1, N1 and N2 operate as described above with respect to pulse generator/regeneration circuit 20 of FIG. 2, and the circuit may also optionally include the current pad and/or current mirror circuit as described in the embodiment of FIG. 2.

Figure 6:
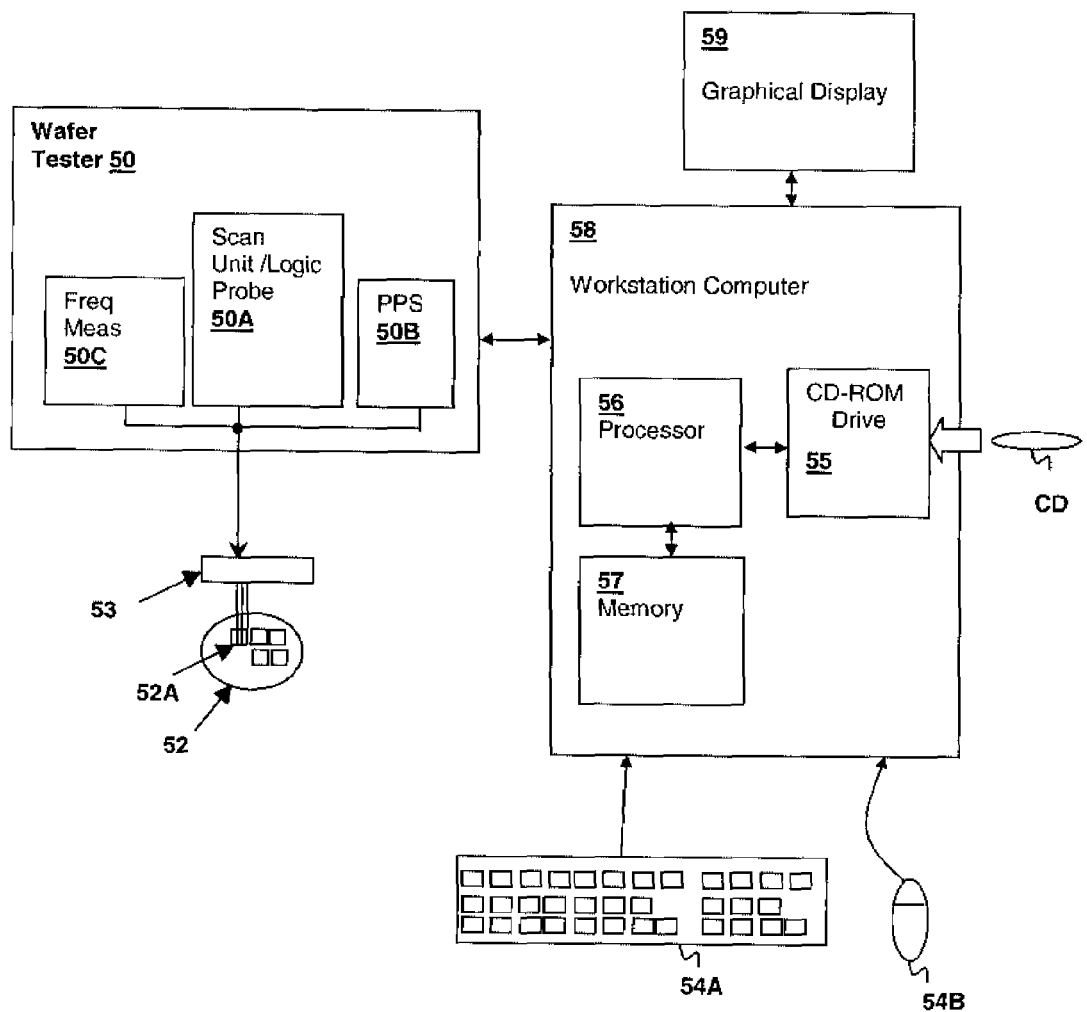
FIG. 6 is a wafer test system in which a method according to the present invention is practiced.

Referring now to FIG. 6, a VLSI wafer test system, in which methods according to an embodiment of the present invention are performed, is depicted. A wafer tester 50 includes a scan unit 50A for providing stimulus to and retrieving data from a die 52A on a wafer under test 52 via a probe head 53 having electrical test connections to die 52A. Wafer tester 50 includes a frequency measurement unit 50C that evaluates a frequency of the ring oscillator. Wafer tester 50 also includes a programmable power supply 50B for supplying control voltages $V_{c1}$ and $V_{c2}$ and optionally measuring current $I_o$ and/or voltage vctr supplied to the pulse generator output driver circuit so that the above-described frequency vs. current matching method described above can be performed during testing.

A workstation computer 58, having a processor 56 coupled to a memory 57, for executing program instructions from memory 57, wherein the program instructions include program instructions for receiving data from wafer tester 50 and/or circuits within wafer 52 in accordance with an embodiment of the present invention, is coupled to wafer tester 50. Generally the methods of the present invention control wordlines, select bitlines, generate the initialization pulse and count the frequency of oscillation of the ring oscillator. Counters may be included within the die circuits to count the frequency, or the frequency counters may be located in wafer tester 50. Program instructions obtain the counts from wafer tester 50 or read the counts from wafer 52, then process the counts to obtain the cell read delay. The program instructions may be loaded from a storage media such as optical disc CD via a CD-ROM drive 55 or other suitable optical or magnetic/non-volatile memory drive. The data produced by embodiments of the present invention are collected from multiple ring oscillator tests of storage cells 10 within dies 52A as control voltage or current is varied by programmable power supply 50B and different storage cells are selected by wordline/bitline switch combinations. The results of all of the measurements can then be evaluated to either change the design of the array or storage cells 10, determine whether fabrication process has deviated exceedingly from tolerable norms or to determine operational ranges such as power supply voltage tolerances and access cycle times.

Data from ring oscillator tests in accordance with embodiments of the invention are transferred to workstation computer 58 via wafer tester 50 and stored in memory 57 and/or other media storage such as a hard disk. Workstation computer 58 is also coupled to a graphical display 59 for displaying program output such as the results of memory tests described hereinafter. Workstation computer 58 is further coupled to input devices such as a mouse 54B and a keyboard 54A for receiving user input. Workstation computer 58 may be coupled to a public network such as the Internet, or may be a private network such as the various "intra-nets" and software containing program instructions for analyzing data produced by methods and circuits in accordance with embodiments of the present invention may be located on remote computers or locally within workstation computer 58. Further, workstation computer 58 may be coupled to wafer tester 50 by such a network connection.

While the system of FIG. 6 depicts a configuration suitable for sequential test of a plurality of dies on a wafer, the depicted system is illustrative and not limiting to the present invention. Probe head 53 may be a multi-die full wafer probe system, or may comprise multiple probe heads for simultaneously testing multiple wafers on a single or multiple die basis. Additionally, while scan chain retrieval and stimulus is illustrated, the techniques of the present invention may also be applied to other interfaces available to probe wafer 52, or applied to circuits implemented in fully functional dies where data extraction is performed over a serial or parallel bus or other interface.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A method of measuring read strength in a storage circuit, comprising:
    first operating a ring oscillator having a node coupled to a bitline that is connected to a storage cell of said storage circuit with said storage cell enabled;
    first measuring a first frequency of oscillation of said ring oscillator during said first operating step;
    second operating said ring oscillator with said storage cell disabled;
    second measuring a second frequency of oscillation of said ring oscillator during said second operating step; and
    determining an indication of a read strength of said storage cell in conformity with a difference between said first frequency of oscillation and said second frequency of oscillation.

2. The method of claim 1, further comprising:
    controlling a current applied to said bitline by said second operating in response to a result of said second measuring until said second frequency of oscillation is equal to said first frequency of oscillation; and
    determining a read current of said storage cell from a value of said controlled current at which said second frequency of oscillation is equal to said first frequency of oscillation.

3. The method of claim 2, further comprising measuring said current and wherein said determining a read current is performed in conformity with a result of said measuring.

4. The method of claim 1, further comprising:
    third operating said ring oscillator with said storage cell disabled and another storage cell enabled, wherein the other storage cell is connected to the bitline; and
    third measuring another frequency of oscillation of said ring oscillator during said third operating, and wherein said determining further determines a variation in said read strength between said storage cell and said other storage cell from a difference between said first frequency of oscillation and said third frequency of oscillation.

5. The method of claim 1, further comprising stretching a width of a pulse portion corresponding to said read current, whereby said first frequency of oscillation remains substantially constant.

6. The method of claim 1, wherein said first frequency of oscillation increases dynamically as said read current shortens a pulse width of said ring oscillator, and wherein said measuring comprises counting a number of pulses of said ring oscillator prior to said first frequency of oscillation exceeding a threshold.

7. The method of claim 5, wherein said stretching further comprises:
    receiving a pulse at an input of a pulse generator corresponding to a read state of said storage cell;
    generating an output from the pulse generator that has a state inverted from a state of said pulse and a period that is extended beyond an end of said pulse, whereby said first frequency of oscillation is maintained as a substantially constant frequency.

8. The method of claim 7, further comprising selecting said bitline from among a plurality of bitlines by enabling a selected first one of a first plurality of switches that selectably couple the bitlines to the input of the pulse generator and enabling a selected second one of a second plurality of switches that selectably couple the bitlines to the output of the pulse generator.

9. The method of claim 1, further comprising selecting said bitline from among a plurality of bitlines by enabling a selected one of a plurality of switches that couple the bitlines to the ring oscillator.

10. A method of measuring variation of read strength in a storage circuit, comprising:
    first operating a ring oscillator having a node coupled to a bitline that is connected to a first storage cell of said storage circuit with said first storage cell enabled;
    first measuring a first frequency of oscillation of said ring oscillator during said first operating step;
    second operating said ring oscillator with said first storage cell disabled while a second storage cell that is connected to the bitline is enabled;
    second measuring a second frequency of oscillation of said ring oscillator during said second operating step; and
    determining an indication of a variation in read strength between said first storage cell and said second storage cell in conformity with a difference between said first frequency of oscillation and said second frequency of oscillation.

11. The method of claim 10, further comprising:
    controlling a current applied to said bitline by said second operating in response to a result of said second measuring until said second frequency of oscillation is equal to said first frequency of oscillation; and
    determining a difference in read current between said first and said second storage cell from a change in value of said controlled current which causes said second frequency of oscillation to be equal to said first frequency of oscillation.

12. The method of claim 11, further comprising measuring said current and wherein said determining a difference in read current is performed in conformity with a result of said measuring.

13. The method of claim 10, further comprising stretching a width of a pulse portion corresponding to a read current of the first storage cell during the first operating and a read current of the second storage cell during the second operating, whereby said first and second frequencies of oscillation remain substantially constant.

14. The method of claim 13, wherein said stretching further comprises:
    receiving pulses at an input of a pulse generator corresponding to a read state of said first storage cell during said first operating and corresponding to a read state of said second storage cell during said second operating;
    generating an output from the pulse generator that has a state inverted from a state of said pulses and a period that is extended beyond an end of said pulses, whereby said first and second frequency of oscillation are maintained as substantially constant frequencies.

15. The method of claim 14, further comprising selecting said bitline from among a plurality of bitlines by enabling a selected first one of a first plurality of switches that selectably couple the bitlines to the input of the pulse generator and enabling a selected second one of a second plurality of switches that selectably couple the bitlines to the output of the pulse generator.

16. The method of claim 10, wherein said first frequency of oscillation increases dynamically as a read current of the first storage cell shortens a pulse width of said ring oscillator, and wherein said first measuring comprises counting a number of pulses of said ring oscillator prior to said first frequency of oscillation exceeding a threshold.

17. A method of measuring read strength in a storage circuit, comprising:

first enabling one of a first plurality of switches that couple an input of a pulse generator to a plurality of bitlines, to select a selected bitline at the input of the pulse generator;

second enabling one of a second plurality of switches that couple an output of a pulse generator to a plurality of bitlines to select the selected bitline at the output of the pulse generator;

third enabling a wordline input to a row of storage cells, whereby a selected storage cell that is coupled to the selected bitline is enabled;

first measuring a first frequency at the output of the pulse generator during the third enabling step to obtain an indication of read current of the selected storage cell;

regenerating a pulse portion of the first frequency corresponding to a read operation of the selected storage cell during the first measuring step to maintain the first frequency substantially constant;

disabling the wordline input to the row of storage cells;

measuring a second frequency at the output of the pulse generator during the disabling step;

varying a current supplied by the output of the pulse generator during the second measuring until the second frequency is equal to the first frequency; and measuring the current supplied by the output of the pulse generator at which the second frequency is equal to the first frequency to obtain an indication of the read strength of the selected storage cell.

* * * * *